United States Patent [19]

Hebenstreit

[11] Patent Number: 4,760,293
[45] Date of Patent: Jul. 26, 1988

[54] COMBINED BIPOLAR AND MOSFET SWITCH

[75] Inventor: Ernst Hebenstreit, Munich, Fed. Rep. of Germany

[73] Assignee: Siemens Aktiengesellschaft, Berlin and Munich, Fed. Rep. of Germany

[21] Appl. No.: 863,811

[22] Filed: May 12, 1986

Related U.S. Application Data

[63] Continuation of Ser. No. 544,156, Oct. 21, 1983.

[30] Foreign Application Priority Data

Nov. 4, 1982 [DE] Fed. Rep. of Germany ....... 3240778

[51] Int. Cl.[4] .................... H03K 17/10; H03K 17/08; H03K 17/56; H03K 17/687
[52] U.S. Cl. .................................. 307/570; 307/446; 307/544; 307/566; 307/270; 307/572
[58] Field of Search ............... 307/570, 270, 446, 449, 307/242, 544, 546–549, 554, 558, 559, 603, 605, 606, 314, 315, 566

[56] References Cited

U.S. PATENT DOCUMENTS

| | | | |
|---|---|---|---|
| 3,601,630 | 8/1971 | Redwine | 307/446 |
| 3,609,479 | 9/1971 | Lin et al. | 307/446 X |
| 3,733,597 | 5/1973 | Healey et al. | 307/570 X |
| 4,274,014 | 6/1981 | Schade, Jr. | 307/585 |
| 4,280,065 | 7/1981 | Minato et al. | 307/270 X |
| 4,347,445 | 8/1982 | Baker | 307/270 X |
| 4,356,416 | 10/1982 | Weischedel | 307/570 |
| 4,360,744 | 11/1982 | Taylor | 307/570 X |
| 4,366,522 | 12/1982 | Baker | 361/91 |
| 4,384,287 | 5/1983 | Sakuma | 307/270 X |
| 4,547,686 | 10/1985 | Chen | 307/572 X |

FOREIGN PATENT DOCUMENTS

| | | | |
|---|---|---|---|
| 1804302 | 10/1968 | Fed. Rep. of Germany | 307/570 |
| 2471702 | 6/1981 | France | 307/570 |
| 2080651 | 2/1982 | United Kingdom | 307/570 |

OTHER PUBLICATIONS

Chen et al., "Application of Transistor Emitter-Open Turn-Off Scheme to High Voltage Power Inverters", IEEE Transactions on Industry Applications, vol. 1A-18, No. 4, pp. 411-415, Jul.-Aug. 1982.

Fischer et al., "Leistungs-MOSFETs in der Energieelekronik Teil IV und Schlub", Elektrie, vol. 36, No. 7, pp. 366-370, 1982.

B. Taylor, HEXFETs in hochsperrenden Schaltungen bei hohem Wirkungsgrad", Elektronik 23/1981, pp. 93 to 96.

Primary Examiner—Stanley D. Miller
Assistant Examiner—David R. Bertelson
Attorney, Agent, or Firm—John Francis Moran

[57] ABSTRACT

Power MOSFETs for switching high voltages have a relatively high on-state DC resistance. The invention provides for the connection in series of a low voltage MOSFET with a higher voltage bipolar transistor. This series circuit is connected in parallel with a series circuit consisting of another MOSFET and a threshold switch. The threshold switch is placed between the base terminal and the free terminal of the low voltage MOSFET. The MOSFETs receive a joint control signal ($u_1$) which is routed to the low voltage MOSFET. In the case of an inductive load with recovery operation, the signal is routed through a delay element that becomes active when the circuit is turned on.

17 Claims, 3 Drawing Sheets

COMBINED BIPOLAR AND MOSFET SWITCH

This is a continuation of Ser. No. 544,156, filed Oct. 21, 1983.

BACKGROUND OF THE INVENTION

The present invention relates to an electronic switch with a MOSFET and a bipolar transistor, in which the collector-emitter section of the bipolar transistor and the drain-source section of the MOSFET are connected in series.

Such a switch has been described, for example, in the periodical "Elektronik," 23/1981, pages 93 to 96. This circuit takes into account the fact that MOSFETs which handle large voltages, for example, those of over 300 V have a relatively high on-state DC resistance $R_{on}$. The combination of bipolar transistor and a MOSFET makes it possible to use a MOSFET designed to handle low voltages with a low on-state DC resistance and a high voltage bipolar transistor, with an on-state DC resistance which is lower than that of a MOSFET with a corresponding voltage handling capability. The disadvantage of the series circuit described above is due to the fact that a separate source of DC voltage is required for the bipolar transistor, or else a capacitor that is dynamically charged through a transformer and whose capacity must be attuned to the clock frequency of the switch must be used, in order to prevent saturation of the bipolar transistor.

SUMMARY OF THE INVENTION

The object of the invention is to provide an electronic switch of the type referred to but with the additional features that its operation is independent of the clock frequency, and that a separate voltage source for the bipolar transistor is unnecessary.

This object and others are achieved by providing a switch with the following characteristics:

(a) A series circuit comprising a bipolar transistor and a MOSFET is arranged in parallel with a series circuit comprising another MOSFET and a threshold element.

(b) The threshold element is placed between the base terminal of the bipolar transistor and the terminal of the MOSFET that is not connected to the bipolar transistor.

(c) A control signal is fed to the gate terminals of the MOSFETs.

In the case where the switches must drive an inductive load with revovery operation, the signal is routed through a delay element that becomes active when the circuit is turned on. The delay element may comprise a resistor and a diode connected in parallel.

In a preferred embodiment the bipolar transistor, referred to above, comprises a Darlington amplifier to provide greater load handling capabilities.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
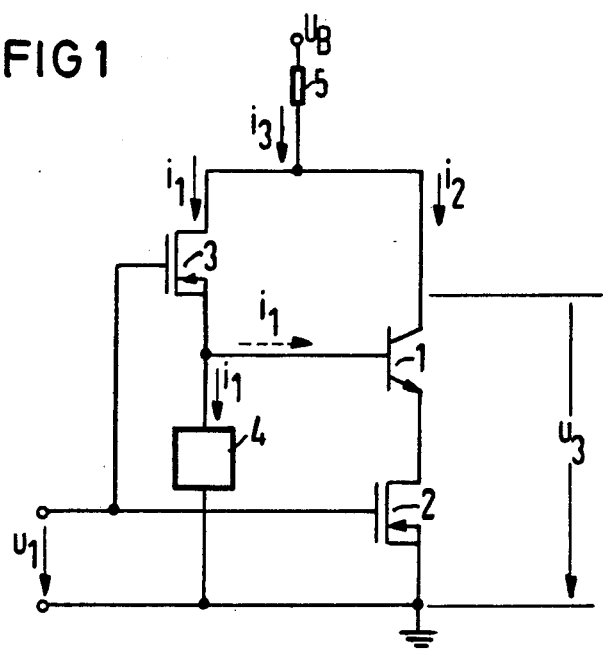
FIG. 1 is a schematic of a first switch embodiment.

The switch shown in FIG. 1 has a series circuit consisting of a high voltage bipolar transistor 1 and a relatively low voltage MOSFET 2. It passes through a load 5 to a supply voltage $U_B$. To the above-mentioned series circuit consisting of a bipolar transistor and a MOSFET is added, in parallel, a series circuit consisting of another MOSFET 3 and a threshold element 4. The threshold element 4, which may be a Zener diode, a diode or several diodes connected in series, is placed between the base terminal of the bipolar transistor 1 and the terminal of the MOSFET 2 that is not connected to the bipolar transistor, in this case the source terminal. The other MOSFET 3 is connected to the supply voltage and therefore has a high voltage cut-off capability. The gate terminals of MOSFETs 2 and 3 are connected to an input terminal, to which a control voltage $u_1$ can be applied.

In explaining the operation, it will be assumed that no control voltage is being applied, so that the electronic switch is closed. At the output of the series circuit consisting of bipolar transistor 1 and MOSFET 2, there is present the voltage $u_3$, which corresponds to the supply voltage $U_B$. When a control voltage $u_1$ is applied, MOSFETs 2 and 3 are conductively driven. This drive has no output, other than the dielectric losses in the MOSFETs. Through MOSFET 3 there then flows a current $i_1$, while MOSFET 2 initially remains without any current, since the bipolar transistor 1 is still cut off. However, the emitter potential of the transistor 1 is approaching zero. As a result, the current $i_1$ flows at least in part as a base current into the bipolar transistor 1, which it opens. If the threshold voltage of the threshold element 4 is higher than the sum of the base-emitter resistance of the bipolar transistor 1 and the drain-source resistance of MOSFET 2, then the flow of current through the threshold element 4 stops. The load current now flows almost entirely as current $i_2$ through the bipolar transistor 1 and MOSFET 2. Through MOSFET 3 flows only the control current $i_1$ for the bipolar transistor 1. Since this current is usually small, the losses in MOSFET 3, which has a relatively high resistance, are negligible. The electronic switch closes, when the input voltage $u_1$ reaches zero.

Figure 2:
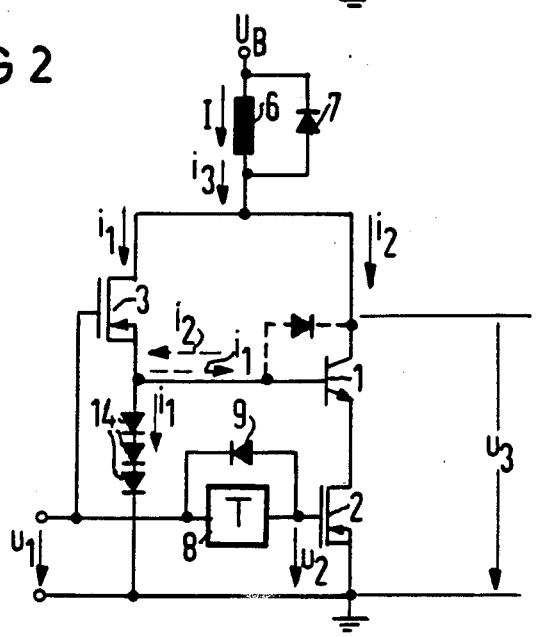
FIG. 2 is a schematic of a second switch embodiment.
Figure 3A:
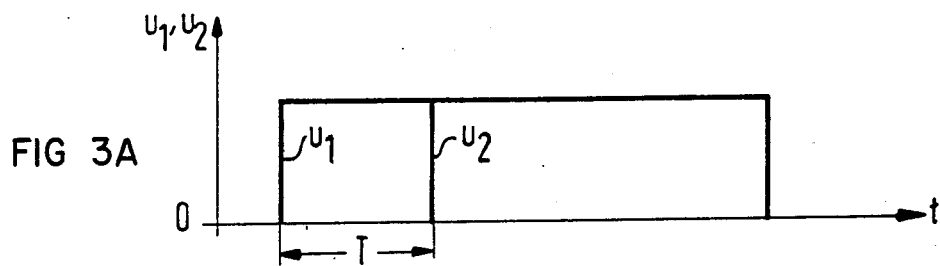
FIGS. 3A, 3B, 3C and 3D show characteristic voltage/current waveforms for the circuit of FIG. 2.
Figure 3B:
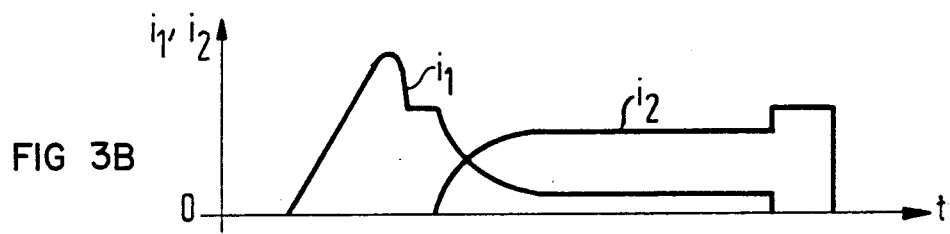
Figure 3C:
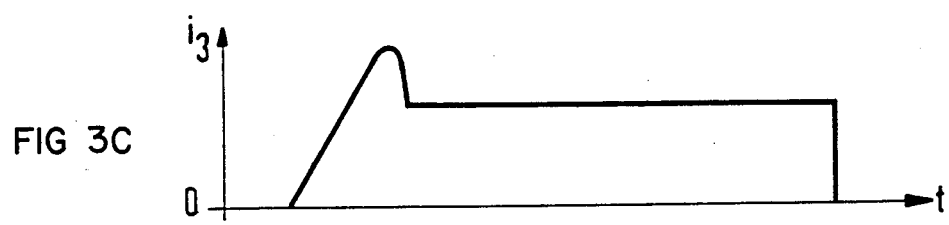
Figure 3D:
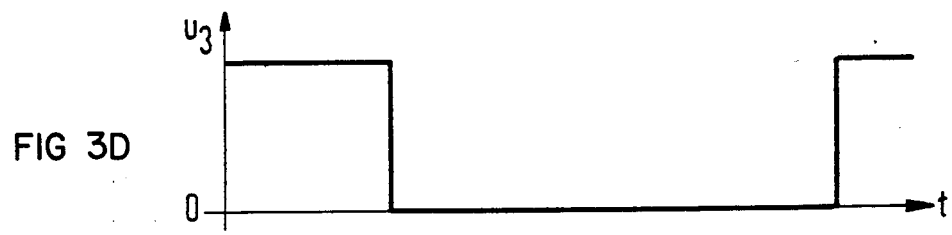

The switch shown in FIG. 1 can also be used, with minor changes, for inductive loads with recovery operation, as occurs for example in the case of motor-regulating units. A switch of this kind is shown in FIG. 2. The load here consists of an inductance 6 and a recovery diode 7. Such an arrangement is driven at a frequency of, for example, about 10 kHZ. In this case a mediumsized load current I flows through the necessary diode 7 in the timing gaps. If the electronic switch is then turned on, it will operate in a short circuit mode until the diode 7 recovers, and is thus exposed to the keenest stresses.

The switch itself is distinguished from the one in FIG. 1 mainly in that the control signal $u_1$ is routed to the MOSFET 2 through a delay element 8. This delay element is effective for voltages of the polarity that cause MOSFET 2 to become conductive. This is shown through a diode 9 which is wired in parallel with the delay element 8. When MOSFET 2 is turned off its gate-source capacitance can be rapidly discharged, and the transistor is quickly cut off. The delay element 8 may consist, for example, of a resistive element.

When a control voltage $u_1$ is applied, only MOSFET 3 is initially turned on, due to the delay element 8. The current then flows first only through the threshold element 4, which, as before, may be a Zener diode, a diode or several diodes 14 in series. Due to the differential resistances of the diodes, a negative feedback takes place for MOSFET 3, as a result of which the peak loads that occur in the abovementioned short-circuit situation are effectively limited. After a delay time T, MOSFET 2 is also turned on and the emitter potential of the bipolar transistor 1 decreases. As a result the current $i_1$ passes as a control current to the transistor 1 and causes it to conduct, so that the major part of the load current flows through the transistors 1 and 2 as current $i_2$.

In order to ensure that the bipolar transistor 1 is not over-loaded, it is desirable for the delay time T to be greater than the time that it takes the diode 7 to recover. In this case a significant flow of current through the transistor 1 does not take place until the voltage $u_3$ has significantly dropped. These conditions are shown in FIGS. 3A–3D. If the Zener voltage of the Zener diode used as the threshold element is made larger than the sum of the base-emitter voltage of the transistor 1 and the source-drain voltage of the MOSFET 2, then the current $i_1$ flows entirely as control current to the transistor 1. If one or more diodes are used, the threshold voltage of these diodes must be greater than the sum of the abovementioned voltages.

If the control voltage $u_1$ is equal to zero, MOSFETs 2 and 3 are cut off simultaneously. The emitter of the bipolar transistor 1 is without current, in which case the current $i_2$ flows through the collector-base junction due to th storage charge. As a result the beginning of the rise in the output voltage $u_3$ is delayed. The rise itself, however, takes place very quickly, since only the capacitance of the base-collector-PN-junction has to be discharged. Since with a diode the case of the so-called second breakthrough, which is based on a thermal overload, cannot take place, the bipolar transistor 1 can be exposed to a cut-off voltage that corresponds to the highest permissible base-collector cut-off voltage. This is higher than the highest permissible emitter-collector voltage.

The circuits described have the advantage that they need no additional voltage sources to drive the bipolar transistor. In addition, the switch is impervious to reverse currents, if one or more diodes are used as a threshold element. This means that, for example, in the case of bridge circuits recovery diodes can be connected in antiparallel with no further equipment being needed. Since the MOSFETs will not conduct reverse currents, the familiar du/dt problems that arise during commutation are eliminated.

In connection with FIG. 2 it was explained that the control voltage is applied to MOSFET 2 through a delay element 8. However, it can also be driven through a separate master clock with a corresponding time lag.

Figure 4:
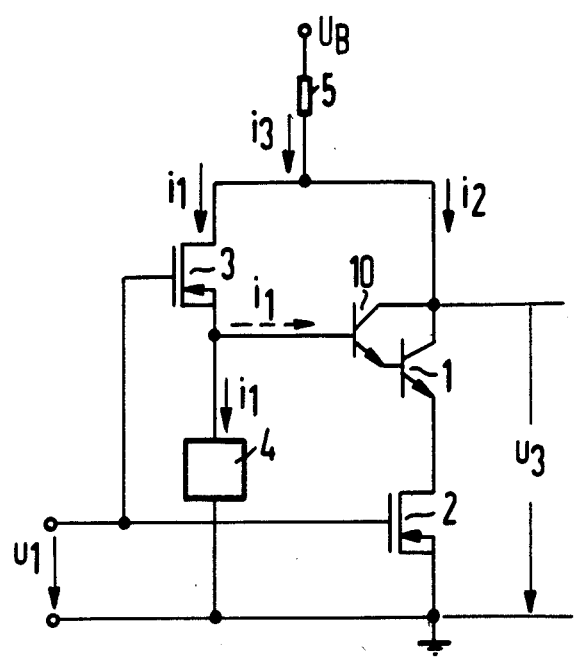
FIG. 4 provides a further embodiment of an electronic switch.

The circuits shown in FIGS. 1 and 2 can be varied by connecting to MOSFET 2, instead of the individual bipolar transistor 1 arranged in series, a Darlington amplifier consisting of two or three bipolar transistors in series. A circuit of this kind, with a Darlington amplifier consisting of two bipolar transistors 1 and 10 is shown in FIG. 4. Here the emitter-collector section of the second (last) bipolar-transistor is connected in series to the drain-source section of MOSFET 2. The series circuit consisting of the other MOSFET 3 and the threshold element 4 is arranged in parallel to the series circuit consisting of bipolar transistor 1 and MOSFET 2. The threshold element 4 is placed between the base terminal of the first transistor 10 of the Darlington amplifier and the source terminal of MOSFET 2.

In both the arrangement shown in FIG. 4 and the arrangement shown in FIG. 2 a delay element 8 can be introduced, which is effective in the presence of a control signal of the same polarity that causes MOSFET 2 to conduct.

There has thus been shown and described a novel electronic switch which fulfills all the object and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An electronic switch, comprising:
   (a) a bipolar transistor having collector, emitter and base terminals, one of said collector and emitter terminals being connectable through a load to a voltage source;
   (b) a first MOSFET transistor having source, drain and gate terminals, one of said source and drain terminals thereof being connected to the other of said emitter and collector terminals of said bipolar transistor;
   (c) a second MOSFET transistor having source, drain and gate terminals, one of said source and drain terminals thereof being connectable through said load to said voltage source;
   (d) a threshold element having at least two terminals, one of said two terminals being connected to the other of said source and drain terminals of said second MOSFET transistor and the other of said two terminals being connected to the other of said source and drain terminals of said first MOSFET transistor; the threshold element for defining a threshold voltage for operating the bipolar transistor;
   (e) input means connected to said gate terminals of said first and second MOSFET transistors for coupling a control signal to said gate terminals of said first and second MOSFET transistors; and
   (f) means connecting said one terminal of said threshold element to said base terminal of said bipolar transistor.

2. Switch according to claim 1, wherein said threshold element comprises at least one diode connected in series.

3. Switch according to claim 1, wherein said threshold element is a Zener diode.

4. Switch according to any one of claims 1 to 3, wherein:
   (a) said switch further comprises a delay element; and
   (b) said control signal is routed to said second MOSFET and is routed to said first MOSFET through said delay element, said delay element being effective in the presence of said control signal and being responsive to the same polarity that causes said first MOSFET to conduct.

5. Switch according to claim 4, wherein said delay element is a resistor with a diode connected in parallel.

6. Switch according to any one of claims 1 to 3, wherein said input means further comprises a separate master clock connected to the gate terminal of said first MOSFET transistor, the separate master clock for supplying a separate control signal to such gate terminal which is a time delayed version of the control signal applied to the gate terminal of said second MOSFET transistor.

7. In an electronic switch having a first MOSFET and at least one bipolar transistor, in which the collector-emitter section of the bipolar transistor and the drain-source section of the first MOSFET are connected in series to form a first series circuit, the improvement comprised in that:
(a) said bipolar transistor is a Darlington amplifier comprising an input and an output bipolar transistor and the drain-source section of the first MOSFET is connected in series to the collector-emitter section of the output bipolar transistor of said Darlington amplifier;
(b) a second series circuit comprising a second MOSFET and a threshold element is connected in parallel with the first series circuit of said bipolar transistor and said first MOSFET, said first and second series circuits being connectable in parallel through a load to a source of voltage;
(c) said threshold element is connected between first MOSFET that is not connected to the output bipolar transistor; and
(d) a control signal is routed to the gate terminals of said first MOSFET and said second MOSFET.

8. Switch according to claim 7, wherein:
(a) said switch further comprises a delay element; and
(b) said control signal is connected to said second MOSFET and connected to said first MOSFET through said delay element, said delay element being effective in the presence of said control signal and being responsive to the same polarity that causes said first MOSFET to conduct.

9. A switching circuit for an inductive load energized from a d-c source, said switching circuit comprising:
a bipolar transistor having first and second power electrodes and a control electrode;
a first field effect transistor (FET) having first and second power electrodes and a gate electrode;
means for connecting the power electrodes of the bipolar transistor and the first FET serially with the load cross the d-c source;
a second FET having first and second power electrodes and a gate electrode, said first and second power electrodes being connected between the first power electrode and the control electrode of the bipolar transistor;
gate drive means connected to the gate electrodes of both FETs and providing rectangular voltage pulses thereto, the FETs being in a conductive stage during the existence of any positive rectangular pulse whereby load current passes through the load, the bipolar transistor and the first FET, the second FET applying a control signal to the control electrode of the bipolar transistor.

10. The switching circuit of claim 9 and including a voltage breakdown device connected between the control electrode of the bipolar transistor and the d-c source, the voltage breakdown device being poled to block current flow away from the control electrode of the bipolar transistor until a predetermined voltage is applied to the breakdown device.

11. The circuit of claim 10 wherein the voltage breakdown device is a zener diode.

12. The circuit of claim 9 and including a diode connected across the load and poled to pass current away from the bipolar transistor.

13. A switching circuit for an inductive load energized from a d-c source and comprising:
a bipolar transistor having collector base and emitter electrodes, the collector electrode connected to a first polarity of the d-c source by means of the inductive load;
a first switch connected between the emitter electrode of the bipolar transistor and a second polarity of the d-c source;
a second switch connected between the inductive load and the base electrode of the bipolar transistor;
means for simultaneously closing or opening said first and second switches in accordance with current requirements of the load, the closing of the first switch providing a load current path from the emitter of the bipolar transistor to the second polarity of the d-c source, the closing of said second switch providing current to the base electrode of the bipolar transistor causing it to switch on, the opening of said switches establishing an emitter open condition on the bipolar transistor and elimination of its base current drive to render it non-conducting.

14. The circuit of claim 13 and including bypass means for passing current from the base electrode of the bipolar transistor to the second polarity of the d-c source when the collector-base voltage exceeds a predetermined value.

15. The circuit of claim 14 wherein the bypass means is a voltage breakdown means connected between the gate electrode of the bipolar transistor and the second polarity of the d-c source.

16. The circuit of claim 13 wherein said first switch is a FET having a source electrode connected to the emitter electrode of the bipolar transistor, a drain electrode to the second polarity of the d-c source and a gate electrode connected to the means for simultaneously opening or closing said first and second switches.

17. The circuit of claim 13 wherein said second switch is a FET having a source electrode connected to the load, a drain electrode connected to the base electrode of the bipolar transistor and a gate electrode connected to the means for simultaneously opening or closing said first and second switches.

* * * * *